US009691773B2

(12) United States Patent
Surthi et al.

(10) Patent No.: US 9,691,773 B2
(45) Date of Patent: Jun. 27, 2017

(54) SILICON BURIED DIGIT LINE ACCESS DEVICE AND METHOD OF FORMING THE SAME

(71) Applicant: NANYA TECHNOLOGY CORP., Tao-Yuan Hsien (TW)

(72) Inventors: Shyam Surthi, Boise, ID (US); Lars Heineck, Garden City, ID (US)

(73) Assignee: NANYA TECHNOLOGY CORP., New Taipei (TW)

( * ) Notice: Subject to any disclaimer, the term of this patent is extended or adjusted under 35 U.S.C. 154(b) by 0 days.

(21) Appl. No.: 14/069,396

(22) Filed: Nov. 1, 2013

(65) Prior Publication Data
US 2015/0123280 A1    May 7, 2015

(51) Int. Cl.
H01L 29/78 (2006.01)
H01L 27/108 (2006.01)
H01L 23/522 (2006.01)

(52) U.S. Cl.
CPC .... H01L 27/10891 (2013.01); H01L 23/5222 (2013.01); H01L 27/10885 (2013.01); H01L 2924/0002 (2013.01)

(58) Field of Classification Search
CPC ......... H01L 27/10891; H01L 21/76232; H01L 21/764; H01L 23/5222; H01L 27/108; H01L 27/10876; H01L 29/66666; H01L 29/7827
USPC ...... 6/E21.546, E29.262, 329, 770; 438/424, 438/522; 257/E21.546, E29.262, 329, 257/770
See application file for complete search history.

(56) References Cited

U.S. PATENT DOCUMENTS

| 5,629,226 A * | 5/1997 | Ohtsuki | H01L 27/10829 257/E21.396 |
| 9,153,559 B2 | 10/2015 | Lee | |
| 2012/0038037 A1 | 2/2012 | Chen | |
| 2012/0248518 A1* | 10/2012 | Li | H01L 21/76229 257/296 |
| 2013/0127019 A1* | 5/2013 | Lee et al. | 257/621 |
| 2013/0146958 A1* | 6/2013 | Kim | H01L 27/10885 257/302 |
| 2013/0187220 A1 | 7/2013 | Surthi | |
| 2013/0187279 A1 | 7/2013 | Surthi | |
| 2014/0061850 A1* | 3/2014 | Cho | H01L 27/0203 257/506 |
| 2014/0308794 A1* | 10/2014 | Lee | H01L 21/76855 438/381 |
| 2014/0353745 A1* | 12/2014 | Kim et al. | 257/331 |

FOREIGN PATENT DOCUMENTS

CN    102760723 A    10/2012
CN    103165539 A    6/2013

* cited by examiner

*Primary Examiner* — David Vu
*Assistant Examiner* — Jonathan Han
(74) *Attorney, Agent, or Firm* — Winston Hsu (57) ABSTRACT

An access device includes a plurality of first digit lines (DL) trenches extending along a first direction, buried digit lines between each DL trench, second and third trenches separating the digit lines, a filling material filling the digit line trenches comprising airgaps in each second trench, a plurality of word line (WL) trenches extending along a second direction, metal word lines deposited on the walls of the word line trenches, a filling material filling the word line trenches.

7 Claims, 7 Drawing Sheets

SILICON BURIED DIGIT LINE ACCESS DEVICE AND METHOD OF FORMING THE SAME

BACKGROUND OF THE INVENTION

1. Field of the Invention

The present invention relates generally to the field of integrated circuit fabrication and, more particularly, to a silicon buried digit line (BDL) access device for memories such as DRAM, wherein the buried digit lines are separated with air gaps.

2. Description of the Prior Art

A continuous challenge in the semiconductor memory industry is to decrease the size of memory cell components in order to increase the packing density of the DRAM chips. Over the last few device generations, DRAM manufacturers have developed alternative cell layouts that reduce the area occupied by the memories on chips. The latest designs allow a significant increase in density by burying the address lines or digit lines into the silicon substrate, then fabricating the transistors and capacitors on top to form a vertical stack. Such devices are also known as buried digit line (BDL) access devices.

However, the current BDL technology still has several drawbacks. For example, the BDL access devices have very high digit line-to-digit line (DL-DL) coupling capacitances. The DL-DL capacitance can reach up to 25%-30% of the total digit line capacitance using current metal Digit line schemes. The high percentage of DL-DL coupling causes significant sense margin loss even though the total digit line capacitance may be lower than in other technologies. For the available sense amp schemes to work, the DL-DL capacitance should not exceed 20% of the total DL capacitance, and even preferably represent less than 10% of the total capacitance. Hence, it is desired to provide an improved BDL device for DRAM applications that is capable of reducing the DL-DL coupling percentage of the total DL capacitance.

SUMMARY OF THE INVENTION

The objective of the present invention to provide an improved BDL device in order solve the above mentioned drawbacks in prior art.

The present invention eliminates the metal digit line of the prior art and only relies on the conduction through heavily doped Si serving as digit line. In this way, more spacer is present between the digit lines thereby reducing the DL-DL capacitance, which improves the quality of the component.

The present invention also provides a process flow enabling the formation of airgaps between the Si only digit lines so as to reduce even further the DL-DL capacitance.

This way, the DL-DL capacitance of the present invention can be reduced to represent only 10-15% of the total capacitance, which enables the use of the actual sense amps for forming advanced DRAM devices. The process is also simplified, thereby reducing manufacturing time and costs.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. Most of the processes utilized in the present invention are well known to those skilled in the art and are not explicitly described or detailed.

In a preferred embodiment of present invention, a substrate 10 is provided. In this substrate, an area is defined to implement the array of the next steps through a first process. The substrate 10 may be a silicon substrate. Shallow Trench Isolations (STI) are formed in the substrate 10 to define a periphery of the device of the present invention (not shown). These STI define an area delimiting later formed bit lines.

Figure 1:
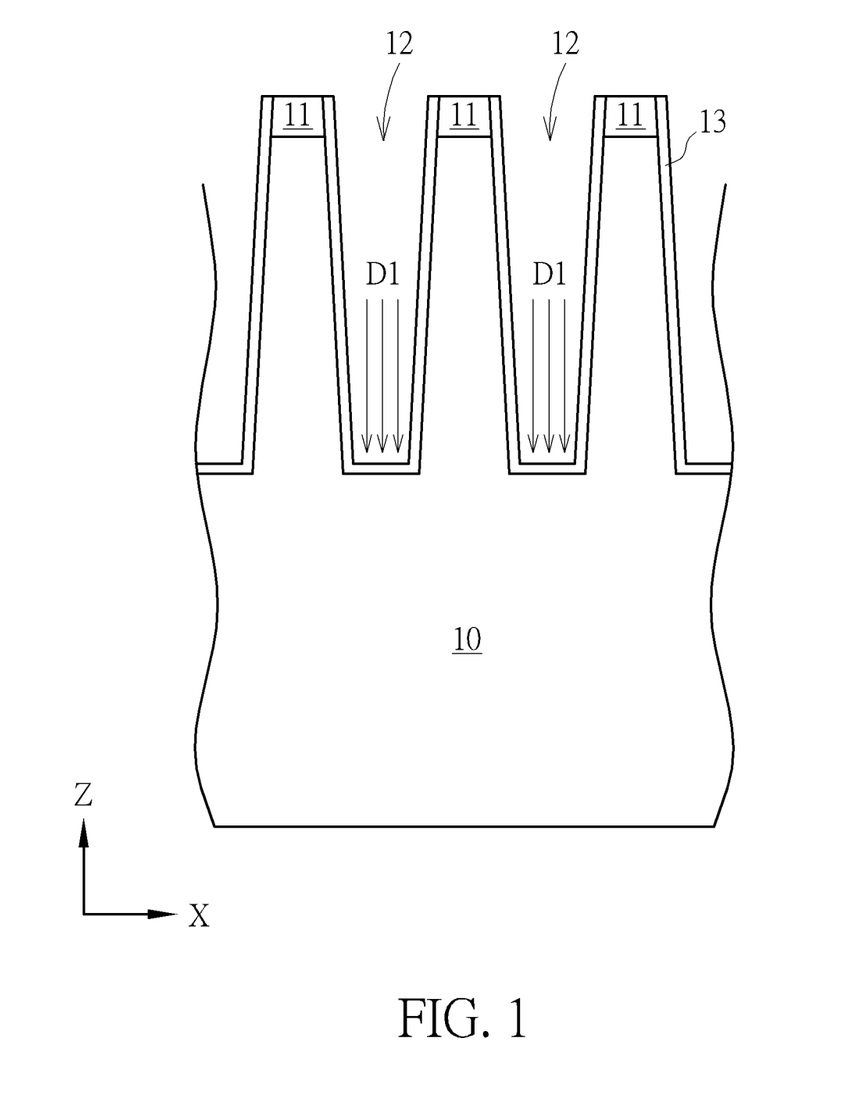
FIG. 1 diagram of a an access device according to a first embodiment of the present invention
Figure 2:
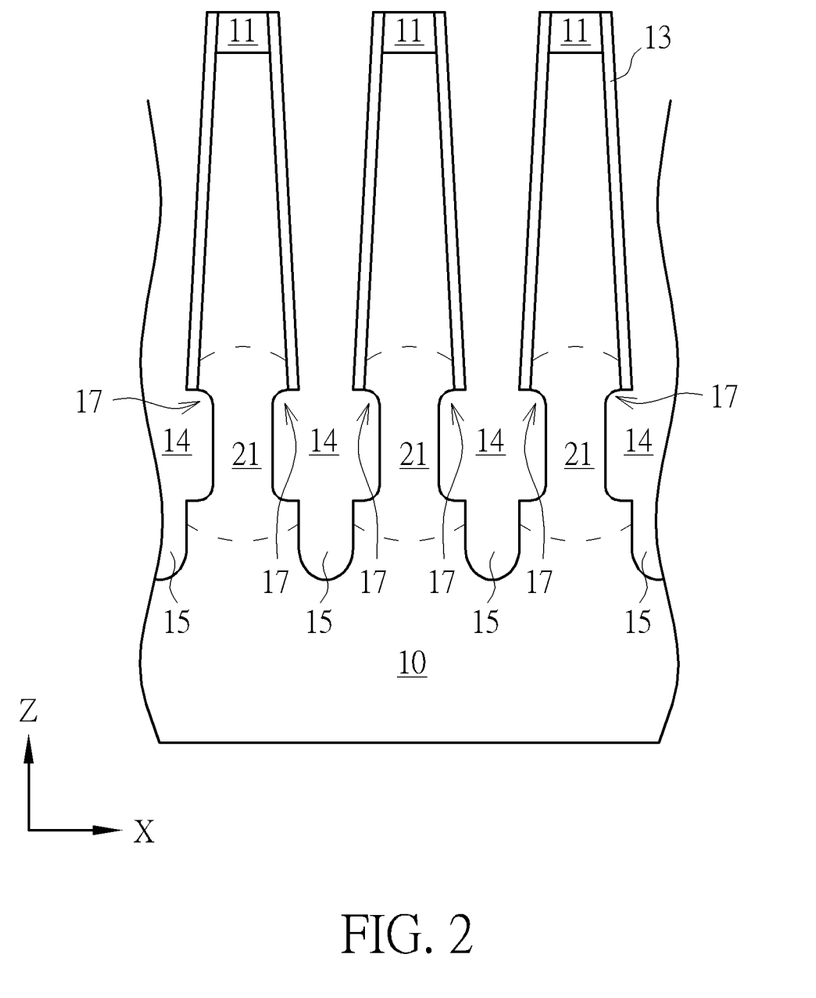
FIGS. 2-3 are schematic cross sectional diagrams of an access device according to the present invention observed from a first direction.
Figure 3:
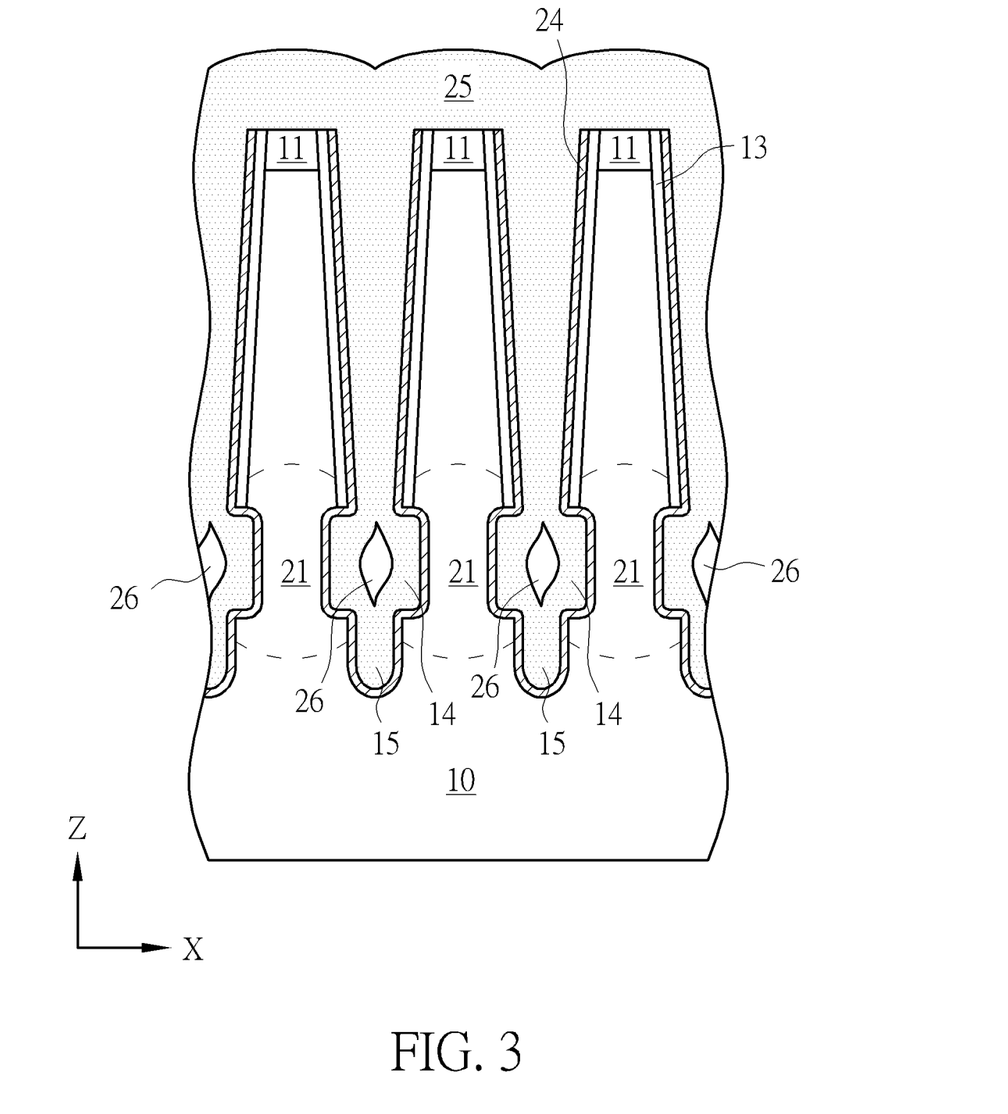

FIGS. 1 to 3 are schematic cross sectional diagrams of an access device according to the present invention observed from a first direction, for example the Y-axis direction. As shown in FIG. 1, a first patterned hard mask layer 11 is deposited to define the pattern of trenches for forming digit lines. The hard mask defines features spaced apart with a pitch comprised between 40 to 60 nm so that the patterned features can be spaced from each other by 15 to 30 nm. The material of the hard mask 11 comprises silicon nitride (SiN), but not limited to. A photolithographic step is performed to etch a plurality of first trenches 12 in the substrate 10. The depth of the first trenches 12 is comprised in a range from 1600 to 2400 Angstroms (A). Then, a first liner 13 is formed on the walls of the trenches 12 through, for example, an oxidation process, or an oxidation process followed by silicon nitride deposition process, but not limited thereto.

According to a first embodiment of the present invention, after the liner 13 is formed, an implantation process D1 is performed so as to implant dopants in the substrate 10 below the trenches 12. The implantation process may include a subsequent drive-in thermal process with a temperature of about 900° C. for a duration of about 30 min, but not limited to; a general range for the implantation process may be comprised in a temperature range of 700 C-1150 C and a time range of seconds to several hours. In the present invention, preferred dopants are arsenic (As) atoms to be diffused in the substrate 10, but not limited to; phosphorus (P) dopants can be used to for forming common n-MOS devices. In the case of a p-MOS device, boron (B) dopants could be used during the implantation process.

In another embodiment, a spacer etch process could be performed before the implantation and drive-in processes, wherein the spacer etch process exposes the silicon at the bottom of the trenches 12.

Please refer now to FIG. 2. After the implantation process D1 has been performed, heavily doped regions of silicon 21, which will serve as digit lines are formed in the substrate 10. Then second trenches 14 are formed in each first trench 12 through an etching process, wherein the second trenches include undercuts 17, so as to separate efficiently the digit lines 21. The depth of the second trenches 14 is comprised in a range between 500 to 1500 angstroms. Third trenches 15 are then formed in each second trench 14 through another etching process in order to achieve the digit line to digit line (DL-to-DL) separation by ensuring that the total depth of the three successive trenches is greater than the depth of the digit line 21.

According to another embodiment of the present invention, the first trenches 12 and the second trenches 14 are first successively formed. Then the implantation process is performed so as to form the buried digit lines 21. In this embodiment, the implantation process D1 preferably is a Gas-Phase Doping (GDP) process, but not limited thereto. The third trenches 15 are then etched after the implantation process. All other methods, materials, properties and process are similar to those of the preferred embodiment.

In another embodiment, the second and third trench etch processes could also be combined into a single step to achieve similar trench profiles. The implant process and the drive-in process performed after the formation of the first trench 12 could therefore use lower dose to form graded junctions and the implant process and the drive-in process preformed after the formation of the second trench 14 could use heavy dose to form the digit line region. All other methods, materials, properties and process are similar to those of the preferred embodiment.

Please refer now to FIG. 3. As shown in FIG. 3, after the third trenches 15 are achieved, another liner 24 is formed uniformly on the walls of the first, second and third trenches. The liner 24 is formed to prevent later deposited dopants of a trench filling material from leaking across the trenches. Methods for forming the liner 24 comprise an oxidation process or an oxide deposition process, and the liner 13 could be removed during the formation of the liner 24, but not limited to wherein the width of the liner 24 is around 5 nm, but not limited to.

After the liner 24 is deposited, a sacrificial filling material 25 is conformally filled into the trenches. The sacrificial filling material comprises polysilicon, doped or undoped amorphous silicon, but not limited to. The conformal way of filling the sacrificial filling material 25 into the trenches will lead to the formation of air gaps 26 in the second trenches 14, due to the shape of the second trenches 14 including undercuts 17, and the inherent pinch at the junction with the first trenches 12.

The sacrificial filling material 25 then undergoes a planarization process. The planarization process can comprise a Chemical Mechanical Polishing (CMP) process or a dry etch process, but not limited to, and will be performed until the top surface of the sacrificial filling material 25 and top surface of the hard mask nitride layer 11 are on the same level.

Figure 4:
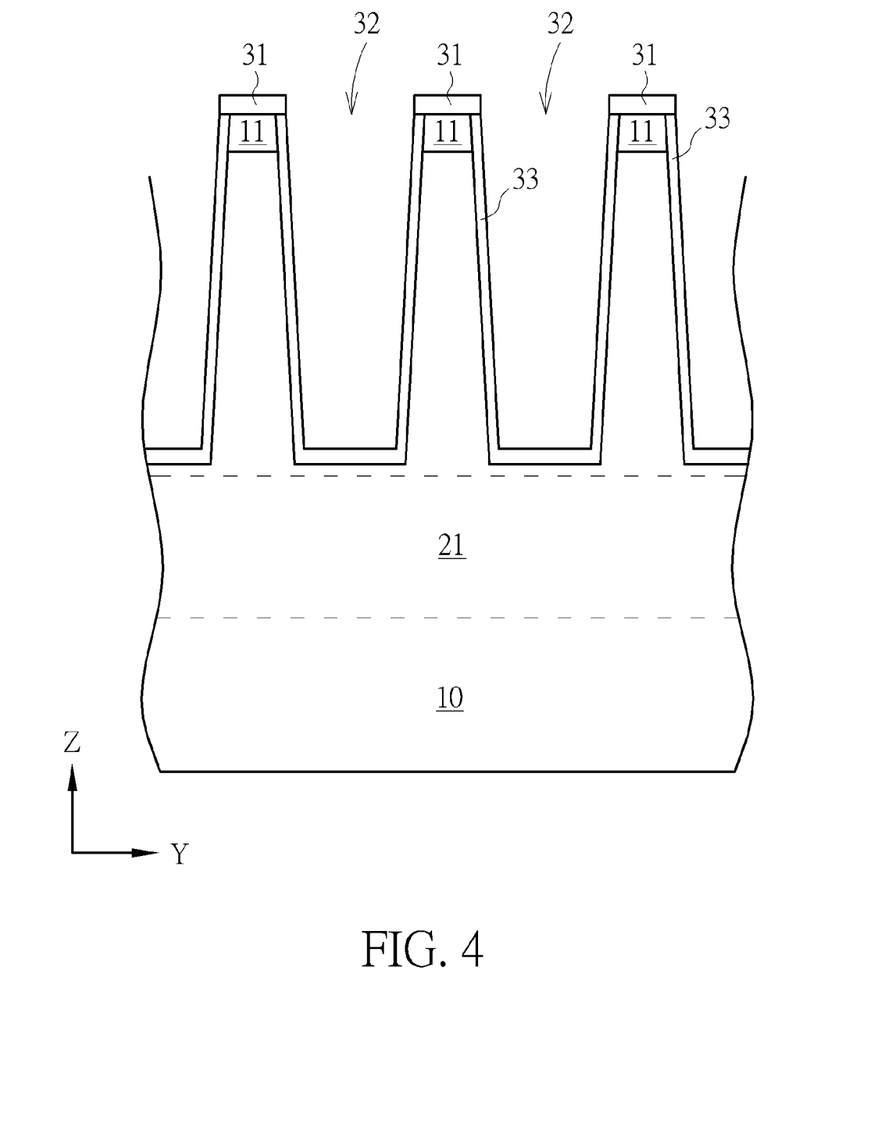
FIGS. 4-6 are schematic cross sectional diagrams of an access device according to the present invention observed from a second direction perpendicular to the first direction.

Please refer now to FIG. 4. FIGS. 4 to 7 are cross sectional schematic diagrams of the access device of the present invention, but observed from a second direction perpendicular to the first direction, for example, the X-axis direction. After the sacrificial silicon filling material has been filled in and planarized, a second patterned hard mask layer 31 is formed on the structure of the present invention. The hard mask 31 defines a pattern for later formed trenches for forming the access device word lines of the present invention, which are a plurality of trenches along a direction perpendicular to the direction of the previously formed digit lines 21. The hard mask layer 31 material can comprise silicon nitride materials, but not limited thereto. A photolithography process is performed to etch a plurality of trenches 32 into the substrate 10 and the previously deposited sacrificial filling material 25 according to the pattern of the hard mask 31. The trenches 32 are etched in a way so that the depth of the trenches 32 is always shallower than the depth of the previously formed digit lines 21. Preferentially the depth of the trenches 32 is comprised in a range of 1000 to 1500 Angstroms (A).

Then a gate oxidation process is performed to form an oxide layer 33 on the walls of the trenches 32. The oxide layer 33 can be formed through an oxidation process or an oxide deposition process, but not limited thereto.

Figure 5:
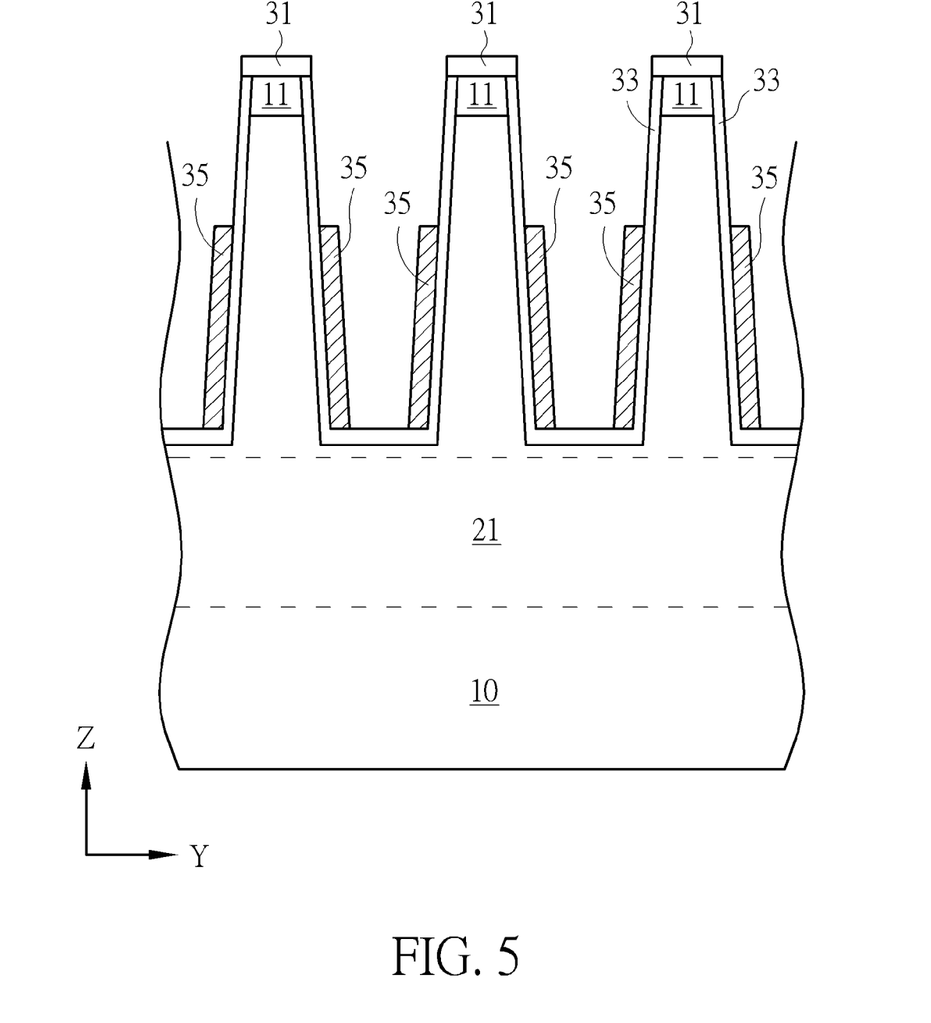

Please refer now to FIG. 5. After the oxide layer 33 has been formed, a metal layer 35 is deposited uniformly in the trenches 32. The metal gate layer material typically comprises titanium nitride (TiN), but not limited thereto. Then a dry etching process is performed to etch parts of the metal layer 35. More precisely, the dry etching process etches the parts of the metal layer 35 situated on the bottom of the trenches 32, so that the parts of the metal layer 35 situated on the walls of the trenches 32 are clearly and distinctly separated, so that they don't contact each other and are sufficiently spaced apart. The dry etching process of these steps also recesses the upper parts of the metal layer 35 situated on the walls of the trenches 32, so as to rectify the height of the word lines by having the top of each part of metal layer 35 below the top surface of the hard mask layers.

Figure 6:
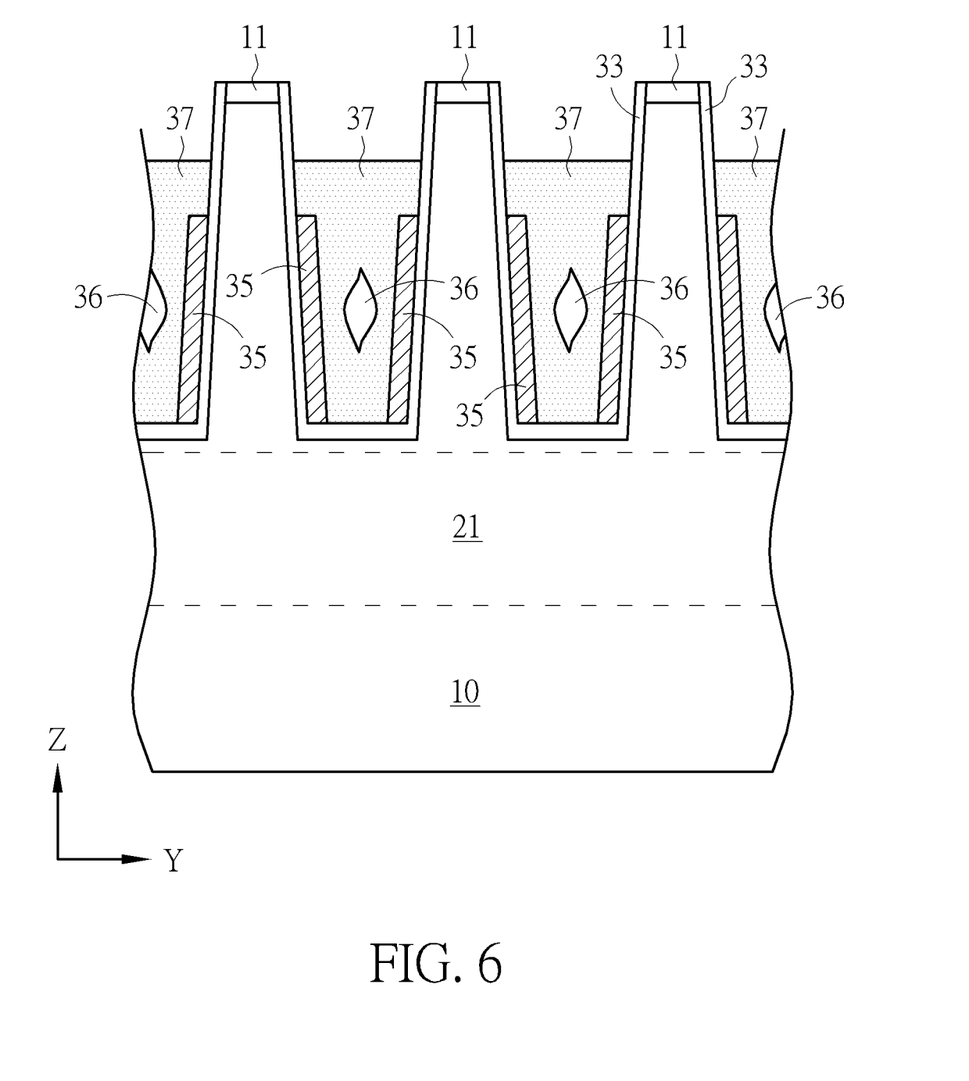

As shown in FIG. 6, after the word lines 35 have been separated and their height recessed to a correct height, an oxide material 37 is deposited in the trenches 32 through a deposition process that can comprise a High Aspect Ratio Process (HARP) or a Plasma-enhanced chemical vapor deposition (PECVD) but not limited thereto. Thanks to the directional nature of the deposition process and the nature of the metal material 35 of the word lines (i.e. TiN), which presents sharp corners, pinching points will be created in the trenches 32. The presence of a pinching point during the deposition process may lead to the formation of small airgaps 36 in the oxide material 37.

Then, a planarization and oxide recess process is performed so as to planarize the oxide material 37 in the trenches 32. The planarization and oxide recess process can comprise of a combination of Chemical Mechanical Polishing (CMP) process and an etch back process or a dry etch back process only, but not limited to. If a planarization process like CMP is used, then the CMP process may stop on the mask 31 or the nitride layer 31 may be fully etched away, and the CMP process may be stopped by the hard mask layer 11. Regardless of the result from the CMP process, the dry etch back process will ensure complete removal of hard mask nitride layer 31 and will also thin down the hard mask 11. During this dry etch back process it is critical to ensure that some amount of nitride hard mask 11 remains. If the entire nitride hard mask 11 is removed, then the sacrificial material removal process may etch through the thin oxide on top of Silicon active area pillars and etch the silicon pillars themselves. The dry etch back process is performed until the top surface of the oxide material 37 is recessed down to below the top surface of the trench walls, for example 20 nm below the top surface, but not limited thereto. At this point, the sacrificial filling material 25 is exposed.

Figure 7:
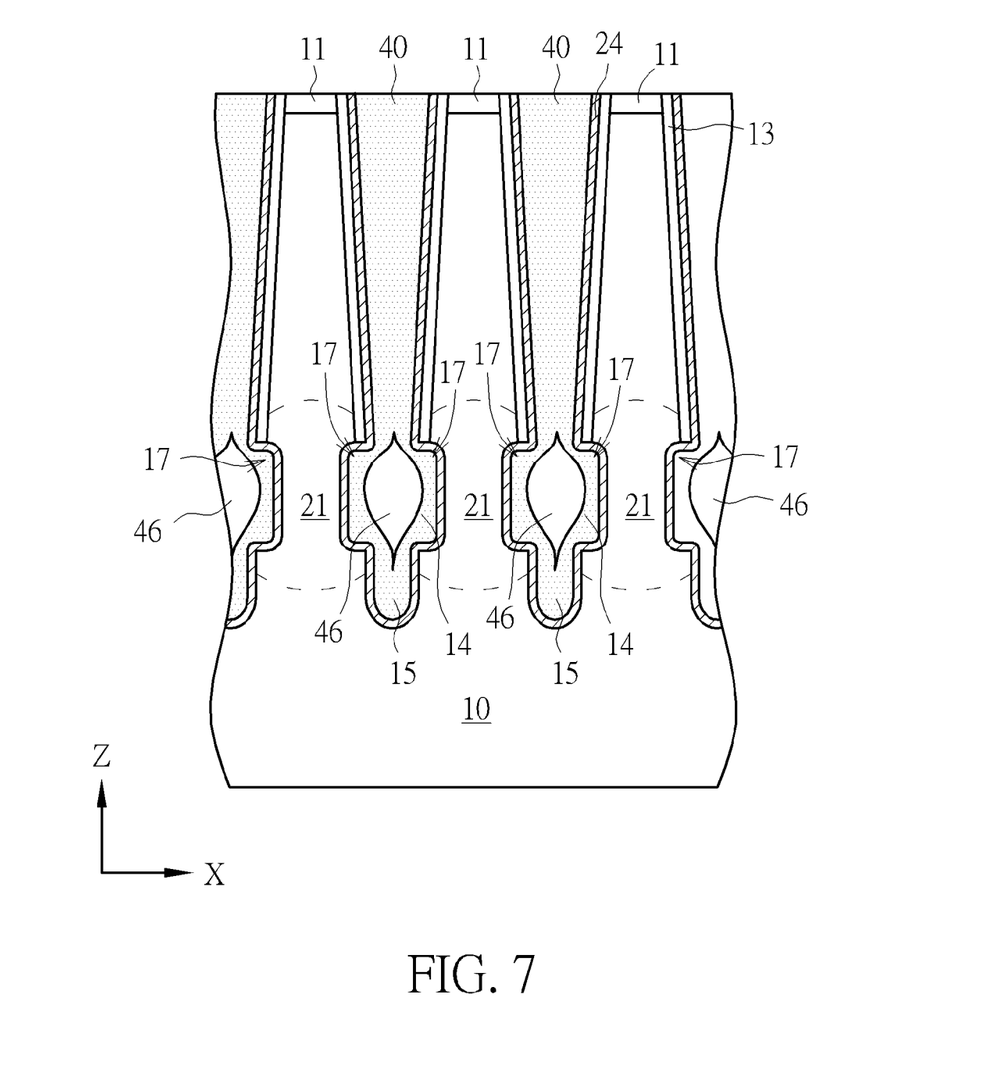
FIG. 7 is schematic cross sectional diagram of an access device according to the present invention observed from a first direction.

Please refer now to FIG. 7. FIG. 7 is a schematic cross sectional diagram of an access device according to the present invention observed from a first direction, for example the Y-axis direction. According to a first embodiment of the present invention, after the CMP process, a wet etching process is performed to remove the totality of the sacrificial filling material 25, wherein the wet etching process has selectivity to nitride and oxide.

The first trenches 12, second trenches 14 and third trenches 15 are filled again with an oxide material 40 through a deposition process comprising a High Density Plasma process or a Plasma-enhanced chemical vapor deposition (PECVD) process, but not limited thereto. The directional nature of the deposition process and the shape of the junction between the first trenches 12 and the second trenches 14 providing a pinching point will lead to the formation of airgaps 46.

Finally the surface of the filled oxide material 40 is planarized so through a planarization process such as a CMP process, so as to level the top surface of the material 40 with the top surface of the remaining hard mask nitride layer 11.

In another embodiment of the present invention, the sacrificial filling material 25 can be removed after the trenches 32 are fully etched. The oxide material 40 is then filled and planarized through the same processes as described above. Then the steps for forming the word lines as described above are performed. All other methods, materials and properties are similar to those of the preferred embodiment.

In another embodiment of the present invention, the sacrificial filling material 25 can be removed after the metal material 35 have been partially or fully etched. The oxide material 40 is then filled and planarized through the same processes as described above. Then the remaining steps for forming the word lines as described above are performed. All other methods, materials and properties are similar to those of the preferred embodiment.

In summary, the present invention provides a novel access device with buried silicon digit lines, which avoids the use of additional processes for forming metal digit lines, thereby suppressing word lines—digit lines concerns and thermal stability issues. The process presented in the present invention also enables an easy way to form airgaps between the buried digit lines by using a sacrificial filling material, thereby reducing the DL-DL coupling, which allows further use of the access device in combination with current sense amp designs. Finally the present invention proposes an easier way to form an access devices with simplified processes, thereby reducing the time and costs of manufacturing of such a device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An access device comprising:
   a substrate;
   a plurality of first trenches in the substrate extending along a first direction;
   a first oxide liner on walls of the first trench;
   a buried digit line (BDL) in the substrate along the first trenches, wherein the buried digit line comprises a doped region of silicon, and wherein the buried digit line does not contain metal;
   a plurality of second trenches formed in each first trench, wherein the second trenches present undercuts;
   a plurality of third trenches formed in each second trench, wherein a depth of the third trenches is deeper than that of the doped region;
   a second oxide liner on walls of the first, second and third trenches;
   a filling material conformally filling the first, second and third trenches, wherein airgaps are formed in the second trenches during the filling process;
   a plurality of word line (WL) trenches in the substrate extending along a second direction, wherein a depth of the word lines trenches is shallower than that of the buried digit lines;
   an oxide liner on walls of the word line trenches;
   a metal layer on parts of the walls of the word lines trenches, wherein the metal layer serves as word lines; and
   a filling material filled into the word line trenches.
2. The access device according to claim 1, wherein the first direction and the second direction are perpendicular to each other.
3. The access device according to claim 1, wherein the filling material is deposited through a High Density Plasma process (HDP) or a Plasma-enhanced chemical vapor deposition (PECVD) process.
4. The access device according to claim 1, wherein a top surface of the metal layer on parts of the walls of the word line trenches is lower than a top surface of the trench walls.
5. The access device according to claim 1, wherein the metal layer comprises titanium nitride (TiN).
6. The access device according to claim 1, wherein a top surface of the filling material in the word line trenches is lower than a top surface of the trench walls, but higher than a top surface of the metal layer.
7. The access device according to claim 1, wherein the filling material of in word line trenches comprises air gaps.

* * * * *